United States Patent
Lin et al.

(10) Patent No.: US 10,374,051 B1
(45) Date of Patent: Aug. 6, 2019

(54) METHOD FOR FABRICATING SEMICONDUCTOR DEVICE

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Ji-Min Lin, Taichung (TW); Yi-Wei Chen, Taichung (TW); Tsun-Min Cheng, Changhua County (TW); Pin-Hong Chen, Tainan (TW); Chih-Chien Liu, Taipei (TW); Chun-Chieh Chiu, Keelung (TW); Tzu-Chieh Chen, Pingtung County (TW); Chih-Chieh Tsai, Kaohsiung (TW); Yi-An Huang, New Taipei (TW); Kai-Jiun Chang, Taoyuan (TW)

(73) Assignees: UNITED MICROELECTRONICS CORP., Hsin-Chu (TW); Fujian Jinhua Integrated Circuit Co., Ltd., Quanzhou, Fujian Province ( * ) Notice: Subject to any disclaimer, the term of this patent is extended or adjusted under 35 U.S.C. 154(b) by 0 days.

(21) Appl. No.: 15/987,891

(22) Filed: May 23, 2018

(30) Foreign Application Priority Data

Apr. 17, 2018 (CN) .......................... 2018 1 0341858

(51) Int. Cl.
*H01L 29/49* (2006.01)
*H01L 29/423* (2006.01)
(Continued)

(52) U.S. Cl.
CPC .... *H01L 29/4958* (2013.01); *H01L 21/28035* (2013.01); *H01L 21/28044* (2013.01); *H01L 21/823437* (2013.01); *H01L 29/4232* (2013.01); *H01L 29/435* (2013.01); *H01L 29/4916* (2013.01); *H01L 29/4941* (2013.01)

(58) Field of Classification Search
CPC ............... H01L 29/435; H01L 29/4958; H01L 29/4232; H01L 29/4916; H01L 29/4941; H01L 21/28035; H01L 21/28044; H01L 21/823437
See application file for complete search history.

(56) References Cited

U.S. PATENT DOCUMENTS 5,903,053 A * 5/1999 Iijima .................... H01L 29/45
257/751
7,153,773 B2 * 12/2006 Otsuki .................... C23C 16/34
438/683

(Continued)

OTHER PUBLICATIONS

C. Theron, Title: Solid-state compound phase formation of TiSi2 thin films under stress; South African Journal of Science 105, Nov. 2009.

*Primary Examiner* — Joseph C. Nicely
(74) *Attorney, Agent, or Firm* — Winston Hsu

(57) ABSTRACT

A method for fabricating semiconductor device includes the steps of: forming a silicon layer on a substrate; forming a metal silicon nitride layer on the silicon layer; forming a stress layer on the metal silicon nitride layer; performing a thermal treatment process; removing the stress layer; forming a conductive layer on the metal silicon nitride layer; and patterning the conductive layer, the metal silicon nitride layer, and the silicon layer to form a gate structure.

11 Claims, 4 Drawing Sheets

(51) Int. Cl.
*H01L 21/28* (2006.01)
*H01L 21/8234* (2006.01)
*H01L 29/43* (2006.01)

(56) References Cited

U.S. PATENT DOCUMENTS

| | | | |
|---|---|---|---|
| 8,558,299 B2 | 10/2013 | Cao et al. | |
| 9,368,572 B1* | 6/2016 | Cheng | H01L 29/7827 |
| 9,583,349 B2 | 2/2017 | Gandikota et al. | |
| 2006/0014355 A1* | 1/2006 | Park | H01L 21/28061 438/382 |
| 2008/0242077 A1* | 10/2008 | Clark | C23C 16/34 438/622 |
| 2010/0120240 A1* | 5/2010 | Rouh | H01L 21/223 438/595 |
| 2012/0001267 A1* | 1/2012 | Lee | H01L 21/28061 257/369 |
| 2012/0153373 A1* | 6/2012 | Chen | H01L 21/28035 257/315 |
| 2012/0196422 A1* | 8/2012 | Flachowsky | H01L 21/28518 438/305 |
| 2014/0367804 A1* | 12/2014 | Takeguchi | H01L 21/28088 257/412 |

* cited by examiner

METHOD FOR FABRICATING SEMICONDUCTOR DEVICE

BACKGROUND OF THE INVENTION

1. Field of the Invention

The invention relates to a method for fabricating semiconductor device, and more particularly to a method for fabricating bit line structure of a dynamic random access memory (DRAM) device.

2. Description of the Prior Art

As electronic products develop toward the direction of miniaturization, the design of dynamic random access memory (DRAM) units also moves toward the direction of higher integration and higher density. Since the nature of a DRAM unit with buried gate structures has the advantage of possessing longer carrier channel length within a semiconductor substrate thereby reducing capacitor leakage, it has been gradually used to replace conventional DRAM unit with planar gate structures.

Typically, a DRAM unit with buried gate structure includes a transistor device and a charge storage element to receive electrical signals from bit lines and word lines. Nevertheless, current DRAM units with buried gate structures still pose numerous problems due to limited fabrication capability. Hence, how to effectively improve the performance and reliability of current DRAM device has become an important task in this field.

SUMMARY OF THE INVENTION

According to an embodiment of the present invention, a method for fabricating semiconductor device includes the steps of: forming a silicon layer on a substrate; forming a metal silicon nitride layer on the silicon layer; forming a stress layer on the metal silicon nitride layer; performing a thermal treatment process; removing the stress layer; forming a conductive layer on the metal silicon nitride layer; and patterning the conductive layer, the metal silicon nitride layer, and the silicon layer to form a gate structure.

According to an embodiment of the present invention, the method further comprising performing the thermal treatment process to form a metal silicide between the silicon layer and the metal silicon nitride layer.

According to an embodiment of the present invention, the silicon layer comprises amorphous silicon, the stress layer includes silicon nitride, and a tensile stress of the stress layer is greater than 2 GPa.

According to an embodiment of the present invention, further comprising forming the stress layer at a temperature between 400° C. to 700° C.

According to an embodiment of the present invention, further comprising performing the thermal treatment process at a temperature between 800° C. to 900° C.

According to an embodiment of the present invention, the metal silicon nitride layer comprises titanium silicon nitride (TiSiN), the conductive layer comprises tungsten (W), and the gate structure comprises a gate insulating layer on the substrate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
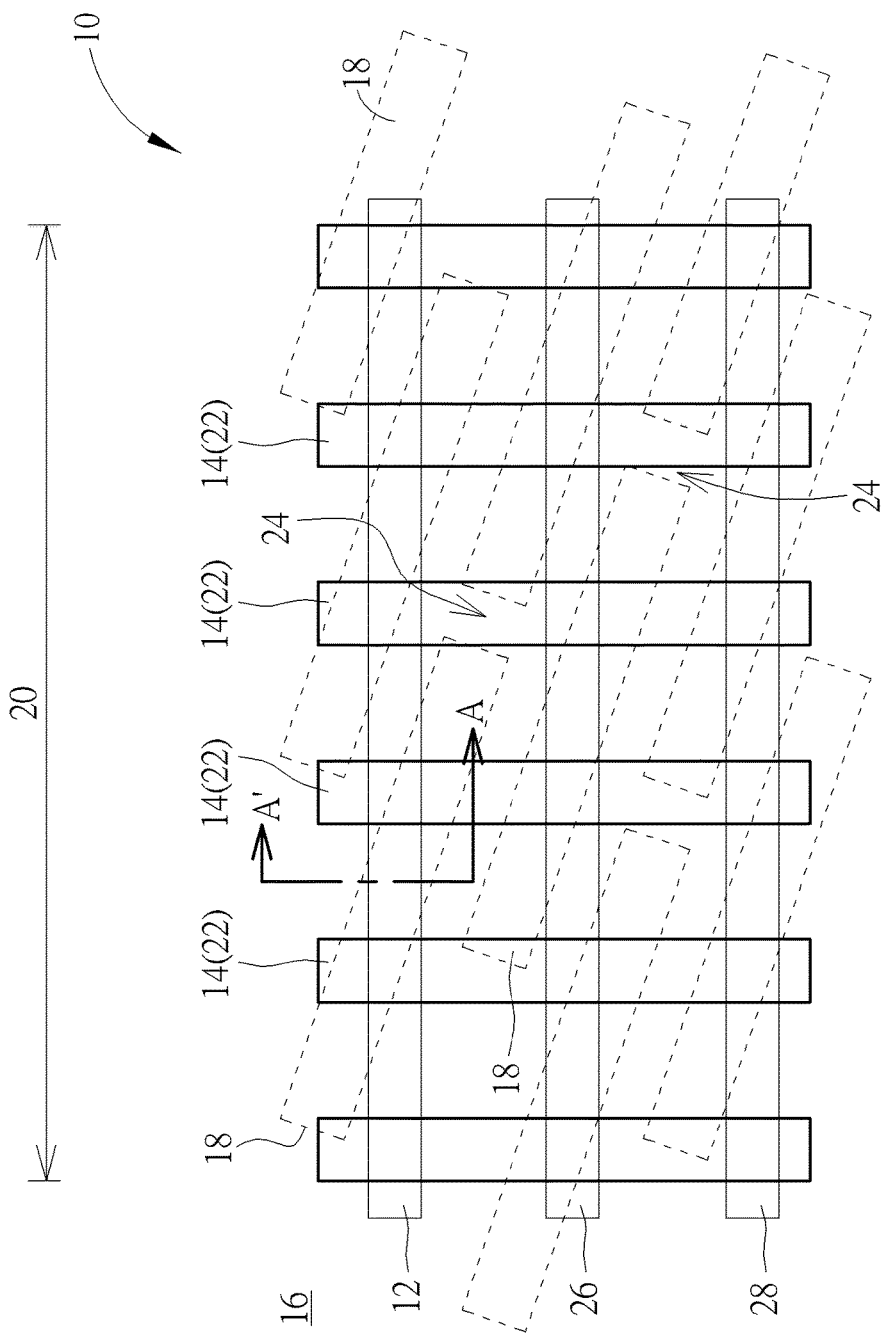
FIG. 1 illustrates a top-view diagram of a DRAM device according to an embodiment of the present invention.

Referring to FIGS. 1-6, FIGS. 1-6 illustrate a method for fabricating a DRAM device according to an embodiment of the present invention, in which FIG. 1 illustrates a top-view diagram for fabricating a DRAM device and FIGS. 2-6 illustrate cross-sectional views of a method for fabricating bit line of the DRAM device along the sectional line AA' of FIG. 1. Preferably, the present embodiment pertains to fabricate a memory device, and more particularly a DRAM device 10, in which the DRAM device 10 includes at least a transistor device (not shown) and at least a capacitor structure (not shown) that will be serving as a smallest constituent unit within the DRAM array and also used to receive electrical signals from bit lines or bit line structures 12, 26, 28 and word lines 14.

As shown in FIG. 1, the DRAM device 10 includes a substrate 16 such as a semiconductor substrate or wafer made of silicon, a shallow trench isolation (STI) 24 formed in the substrate 16, and a plurality of active areas (AA) 18 defined on the substrate 16. A memory region 20 and a periphery region (not shown) are also defined on the substrate 16, in which multiple word lines 14 and multiple bit line structures 12, 26, 28 are preferably formed on the memory region 20 while other active devices (not shown) could be formed on the periphery region. For simplicity purpose, only devices or elements on the memory region 20 are shown in FIG. 1 while elements on the periphery region are omitted.

In this embodiment, the active regions 18 are disposed parallel to each other and extending along a first direction, the word lines 14 or multiple gates 22 are disposed within the substrate 16 and passing through the active regions 18 and STI 24. Specifically, the gates 22 are disposed extending along a second direction such as Y-direction, in which the second direction crosses the first direction at an angle less than 90 degrees.

The bit line structures 12, 26, 28 are disposed on the substrate 16 parallel to each other and extending along a third direction such as X-direction while crossing the active regions 18 and the STI 24, in which the third direction is different from the first direction and orthogonal to the second direction. In other words, the first direction, second direction, and third direction are all different from each other while the first direction is not orthogonal to both the second direction and the third direction. Preferably, contact plugs such as bit line contacts (BLC) (not shown) are formed in the active regions 18 adjacent to two sides of the word lines 14 to electrically connect to source/drain region (not shown) of each transistor element and storage node contacts (not shown) are formed to electrically connect to a capacitor.

Figure 2:
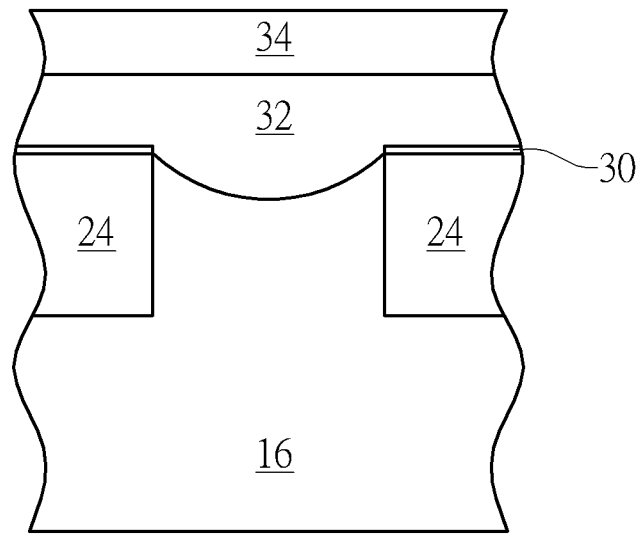
FIGS. 2-6 illustrate cross-sectional views of a method for fabricating bit line of the DRAM device along the sectional line AA' of FIG. 1.

The fabrication process conducted after the formation of word lines 14 (or also referred to as buried word lines) and STI 24 is explained below. First as shown in FIG. 2, a STI 24 is formed in the substrate 16 to define the active regions 18 and word lines (not shown) are formed in part of the STI 24 and the substrate 16, and an insulating layer or more specifically a gate insulating layer 30 is formed on the surface of the STI 24 and the substrate 16. Preferably, the gate insulating layer 30 is serving as a gate insulating layer on the periphery region while serving as a mask layer on the memory region 20 in this embodiment. Next, a photo-etching process is conducted by using patterned mask (not shown) as mask to remove part of the gate insulating layer 30 between the STI 24 and part of the substrate 16 to form a recess (not shown) and then form a semiconductor layer or more specifically a silicon layer 32 in the recess and on the surface of the gate insulating layer 30, in which part of the silicon layer 32 directly contacting the substrate 16 preferably serves as a bit line contact (BLC) after a patterning process is conducted afterwards. Next, a selective pre-clean process could be conducted to remove impurities on the surface of the silicon layer 32, and then an atomic layer deposition (ALD) process is conducted to form a metal silicon nitride layer 34 on the surface of the silicon layer 32.

In this embodiment, the gate insulating layer 30 is preferably a single-layered structure made of silicon oxide. Nevertheless, according to an embodiment of the present invention, the gate insulating layer 30 could also be a multi-layered structure made of a silicon oxide layer, a silicon nitride, layer, and another silicon oxide layer, which is also within the scope of the present invention. The silicon layer 32 disposed on the gate insulating layer 30 preferably includes amorphous silicon, but not limited thereto.

Figure 3:
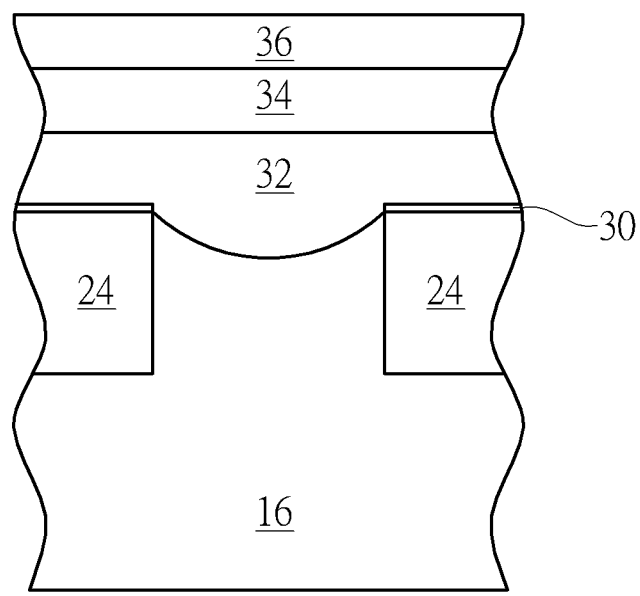

Next, as shown in FIG. 3, a plasma enhanced chemical vapor deposition (PECVD) process is conducted to form a stress layer 36 over the surface of the metal silicon nitride layer 34. In this embodiment, the stress layer 36 is preferably formed at a temperature between 400° C. to 700° C. and the stress layer 36 preferably includes a tensile stress layer made of silicon nitride.

Figure 4:
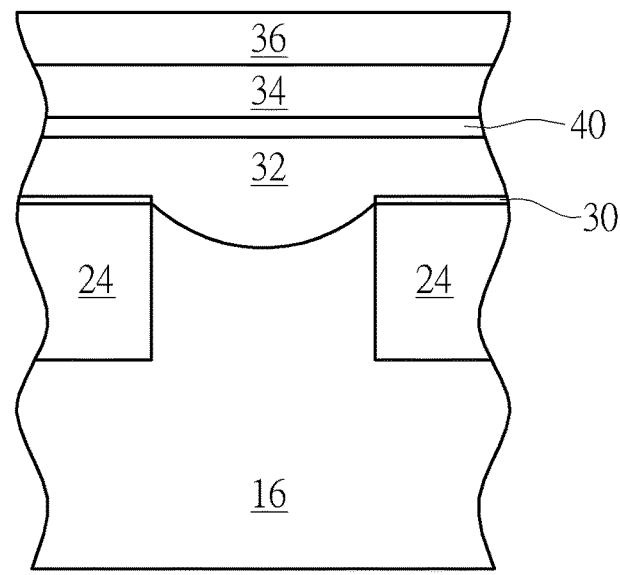

Next, as shown in FIG. 4, a thermal treatment process 38 is conducted on the stress layer 36 at a temperature between 800° C. to 900° C. It should be noted that a metal silicide 40 is preferably formed between the silicon layer 32 and the metal silicon nitride layer 34 while the thermal treatment process 38 is conducted on the stress layer 36, in which the metal silicide 40 preferably includes titanium silicide. In this embodiment, the tensile stress of the stress layer 36 heated by the thermal treatment process 38 could be increased to greater than 2 GPa and such increase in the tensile stress could facilitate the formation of metal silicide 40 between the silicon layer 32 and the metal silicon nitride layer 34.

Figure 5:
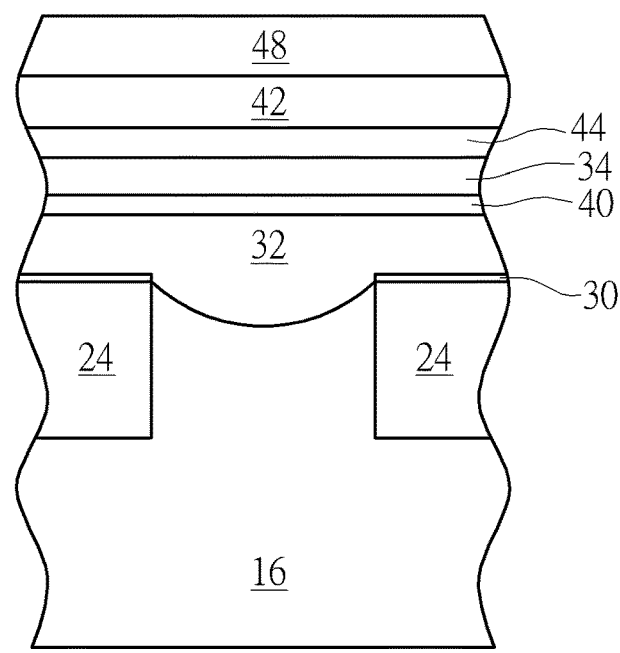

Next, as shown in FIG. 5, an etching process could be conducted to completely remove the stress layer 36 and expose the metal silicon nitride layer 34 underneath, and a conductive layer 42 and a cap layer 48 could be sequentially formed on the surface of the metal silicon nitride layer 34, in which the conductive layer 42 preferably includes tungsten and the cap layer 48 preferably includes silicon nitride. It should be noted that an optional thermal treatment process (such as an anneal process) could be conducted during the formation of the conductive layer 42 so that an additional metal silicide 44 could be formed between the metal silicon nitride layer 34 and the conductive layer 42, in which the metal silicide 44 preferably includes tungsten silicide.

Figure 6:
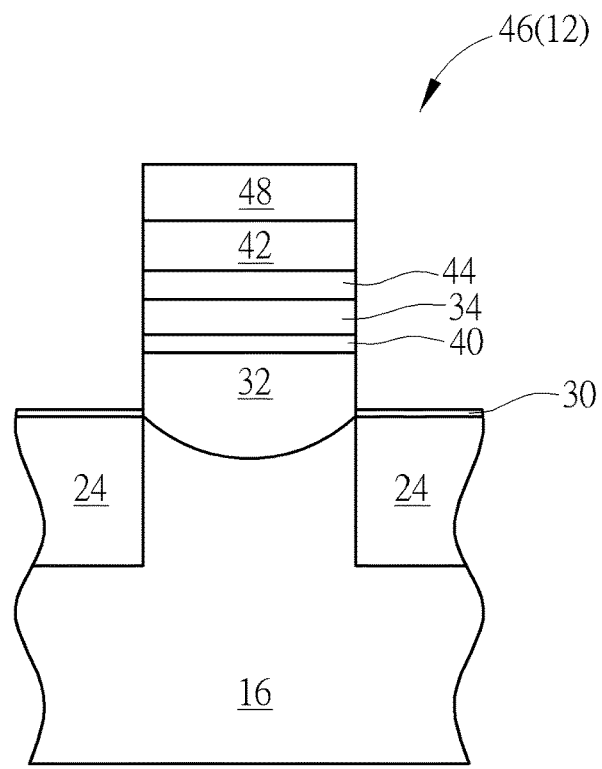

Next, as shown in FIG. 6, a patterning or photo-etching process could be conducted to pattern the cap layer 48, the conductive layer 42, the metal silicide 44, the metal silicon nitride layer 34, the metal silicide 40, and the silicon layer 32 to form a gate structure 46 on the substrate 16. Specifically, the gate structure 46 formed at this stage preferably serving as a bit line structure 12 for a DRAM device while part of the silicon layer 32 directly contacting the substrate 16 is serving as a bit line contact. Next, storage node contacts could be formed adjacent to two sides of the bit line structure 12 to electrically connect source/drain regions and capacitors formed in the later process. Since the fabrication of storage node contacts and capacitors is well known to those skilled in the art, the details of which are not explained herein for the sake of brevity.

Figure 7:
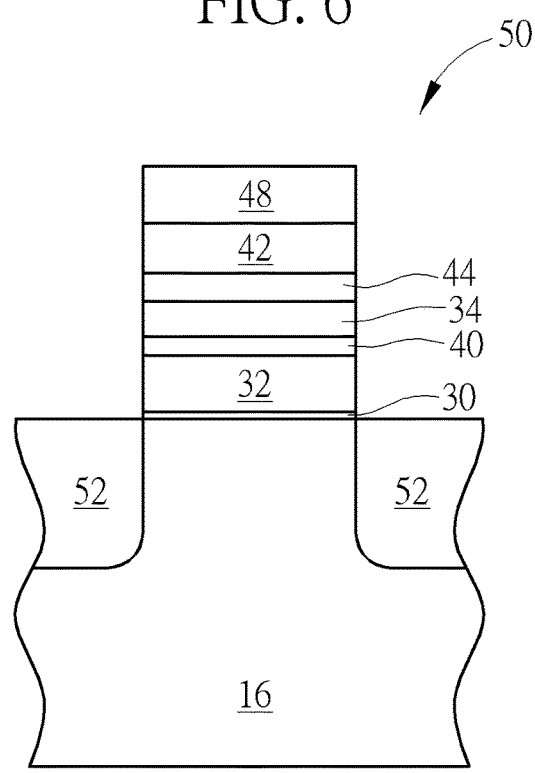
FIG. 7 illustrates a structural view of a gate structure formed on the periphery region according to an embodiment of the present invention.

Referring to FIG. 7, FIG. 7 illustrates a structural view of a semiconductor device according to an embodiment of the present invention. As shown in FIG. 7, it would also be desirable to form the bit line structure 12 on the memory region 20 according to the process disclosed from FIGS. 2-6 and at the same time form another gate structure 50 on the substrate 16 on the periphery region, in which the gate structure 50 preferably includes a silicon layer 32 disposed on the substrate 16, a gate insulating layer 30 disposed between the silicon layer 32 and the substrate 16, a metal silicon nitride layer 34 disposed on the silicon layer 32, a metal silicide 40 disposed between the silicon layer 32 and the metal silicon nitride layer 34, a conductive layer 42 disposed on the metal silicon nitride layer 34, a metal silicide 44 disposed between the metal silicon nitride layer 34 and the conductive layer 42, and a cap layer 48 disposed on the conductive layer 42. In contrast to having STI 24 disposed adjacent to two sides of the gate structure 46 as shown in FIG. 6, a source/drain region 52 is disposed in the substrate 16 adjacent to two sides of the gate structure 50 on the periphery region, in which the source/drain region 52 could include n-type or p-type dopants depending on the type of transistor being fabricated.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   forming a silicon layer on a substrate;
   forming a metal silicon nitride layer on the silicon layer;
   forming a stress layer on the metal silicon layer;
   performing a thermal treatment process;
   removing the stress layer;
   forming a conductive layer on the metal silicon nitride layer; and
   patterning the conductive layer, the metal silicon nitride layer, and the silicon layer to form a gate structure.

2. The method of claim 1, further comprising performing the thermal treatment process to form a metal silicide between the silicon layer and the metal silicon nitride layer.

3. The method of claim 1, wherein the silicon layer comprises amorphous silicon.

4. The method of claim 1, further comprising forming the stress layer at a temperature between 400° C. to 700° C.

5. The method of claim 1, wherein the stress layer comprises a tensile stress layer.

6. The method of claim 1, wherein the stress layer comprises silicon nitride.

7. The method of claim 1, wherein a tensile stress of the stress layer is greater than 2 GPa.

8. The method of claim 1, further comprising performing the thermal treatment process at a temperature between 800° C. to 900° C.

9. The method of claim 1, wherein the metal silicon nitride layer comprises titanium silicon nitride (TiSiN).

10. The method of claim 1, wherein the conductive layer comprises tungsten (W).

11. The method of claim 1, wherein the gate structure comprises a gate insulating layer on the substrate.

\* \* \* \* \*